(12) United States Patent
Shearer

(10) Patent No.: US 11,440,142 B2
(45) Date of Patent: Sep. 13, 2022

(54) ALTERNATIVE COMPOSITIONS FOR HIGH TEMPERATURE SOLDERING APPLICATIONS

(71) Applicant: Ormet Circuits, Inc., San Diego, CA (US)

(72) Inventor: Catherine A Shearer, San Marcos, CA (US)

(73) Assignee: Ormet Circuits, Inc., San Diego, CA (US)

( * ) Notice: Subject to any disclaimer, the term of this patent is extended or adjusted under 35 U.S.C. 154(b) by 518 days.

(21) Appl. No.: 15/109,115

(22) PCT Filed: Jan. 16, 2014

(86) PCT No.: PCT/US2013/074497
§ 371 (c)(1),
(2) Date: Jun. 29, 2016

(87) PCT Pub. No.: WO2014/082100
PCT Pub. Date: May 30, 2014

(65) Prior Publication Data
US 2016/0368103 A1  Dec. 22, 2016

Related U.S. Application Data

(60) Provisional application No. 61/727,674, filed on Nov. 17, 2012.

(51) Int. Cl.
*B23K 35/26* (2006.01)
*B23K 35/30* (2006.01)
(Continued)

(52) U.S. Cl.
CPC .......... *B23K 35/262* (2013.01); *B23K 35/025* (2013.01); *B23K 35/0244* (2013.01); *B23K 35/26* (2013.01); *B23K 35/264* (2013.01); *B23K 35/266* (2013.01); *B23K 35/268* (2013.01); *B23K 35/30* (2013.01); *B23K 35/302* (2013.01); *B23K 35/3006* (2013.01); *B23K 35/3013* (2013.01); *B23K 35/3026* (2013.01);
(Continued)

(58) Field of Classification Search
None
See application file for complete search history.

(56) References Cited

U.S. PATENT DOCUMENTS 5,376,403 A   12/1994  Capote et al.
5,538,789 A   7/1996   Capote et al.
(Continued)

FOREIGN PATENT DOCUMENTS

WO   1993006943 A1   4/1993
WO   1998039105 A1   9/1998
(Continued)

OTHER PUBLICATIONS

WIPO, "International Search Report for PCT/US13/74497", dated Apr. 16, 2014.

*Primary Examiner* — Colin W. Slifka
(74) *Attorney, Agent, or Firm* — Mitchell Brustein

(57) ABSTRACT

Invention compositions are a replacement for high melting temperature solder pastes and preforms in high operating temperature and step-soldering applications. In the use of the invention, a mixture of metallic powders reacts below 350 degrees C. to form a dense metallic joint that does not remelt at the original process temperature.

18 Claims, 4 Drawing Sheets

(51) Int. Cl.
  *B23K 35/02* (2006.01)
  *H05K 3/34* (2006.01)
  *H01L 23/00* (2006.01)
  *B23K 35/36* (2006.01)
  *B23K 35/362* (2006.01)

(52) U.S. Cl.
  CPC ........ *B23K 35/3033* (2013.01); *B23K 35/362* (2013.01); *B23K 35/3612* (2013.01); *H01L 24/29* (2013.01); *H01L 24/32* (2013.01); *H01L 24/83* (2013.01); *H05K 3/3463* (2013.01); *H01L 24/05* (2013.01); *H01L 24/27* (2013.01); *H01L 2224/04026* (2013.01); *H01L 2224/05639* (2013.01); *H01L 2224/2732* (2013.01); *H01L 2224/2741* (2013.01); *H01L 2224/27312* (2013.01); *H01L 2224/27318* (2013.01); *H01L 2224/27418* (2013.01); *H01L 2224/2929* (2013.01); *H01L 2224/2932* (2013.01); *H01L 2224/2936* (2013.01); *H01L 2224/2938* (2013.01); *H01L 2224/2946* (2013.01); *H01L 2224/2948* (2013.01); *H01L 2224/2949* (2013.01); *H01L 2224/29294* (2013.01); *H01L 2224/29301* (2013.01); *H01L 2224/29305* (2013.01); *H01L 2224/29309* (2013.01); *H01L 2224/29311* (2013.01); *H01L 2224/29313* (2013.01); *H01L 2224/29314* (2013.01); *H01L 2224/29316* (2013.01); *H01L 2224/29317* (2013.01); *H01L 2224/29318* (2013.01); *H01L 2224/29324* (2013.01); *H01L 2224/29338* (2013.01); *H01L 2224/29339* (2013.01); *H01L 2224/29344* (2013.01); *H01L 2224/29347* (2013.01); *H01L 2224/29349* (2013.01); *H01L 2224/29355* (2013.01); *H01L 2224/29357* (2013.01); *H01L 2224/29364* (2013.01); *H01L 2224/29369* (2013.01); *H01L 2224/29373* (2013.01); *H01L 2224/29384* (2013.01); *H01L 2224/29386* (2013.01); *H01L 2224/29411* (2013.01); *H01L 2224/29424* (2013.01); *H01L 2224/29438* (2013.01); *H01L 2224/29439* (2013.01); *H01L 2224/29444* (2013.01); *H01L 2224/29447* (2013.01); *H01L 2224/29449* (2013.01); *H01L 2224/29455* (2013.01); *H01L 2224/29457* (2013.01); *H01L 2224/29464* (2013.01); *H01L 2224/29469* (2013.01); *H01L 2224/29473* (2013.01); *H01L 2224/29484* (2013.01); *H01L 2224/29486* (2013.01); *H01L 2224/29499* (2013.01); *H01L 2224/3201* (2013.01); *H01L 2224/325* (2013.01); *H01L 2224/32145* (2013.01); *H01L 2224/32225* (2013.01); *H01L 2224/832* (2013.01); *H01L 2224/8321* (2013.01); *H01L 2224/83075* (2013.01); *H01L 2224/8384* (2013.01); *H01L 2224/83191* (2013.01); *H01L 2224/83192* (2013.01); *H01L 2224/83203* (2013.01); *H01L 2224/83439* (2013.01); *H01L 2224/83825* (2013.01)

(56) References Cited

U.S. PATENT DOCUMENTS

| | | |
|---|---|---|
| 5,565,267 A | 10/1996 | Capote et al. |
| 5,716,663 A | 2/1998 | Capote et al. |
| 5,830,389 A | 11/1998 | Capote et al. |
| 5,922,397 A | 7/1999 | Brandt et al. |
| 5,948,533 A | 9/1999 | Gallagher et al. |
| 5,980,785 A | 11/1999 | Xi et al. |
| 6,068,782 A | 5/2000 | Brandt et al. |
| 6,127,619 A | 10/2000 | Xi et al. |
| 8,221,518 B2 | 7/2012 | Shearer et al. |
| 8,840,700 B2 | 9/2014 | Shearer et al. |
| 9,003,648 B2 | 4/2015 | Holcomb |
| 9,005,330 B2 | 4/2015 | Shearer et al. |
| 2007/0152026 A1 | 7/2007 | Suh et al. |
| 2010/0096043 A1 | 4/2010 | McCluskey et al. |
| 2010/0252616 A1 | 10/2010 | Shearer et al. |
| 2011/0171372 A1 | 7/2011 | Shearer et al. |
| 2014/0042212 A1 | 2/2014 | Shearer et al. |
| 2014/0120356 A1 | 5/2014 | Shearer et al. |
| 2014/0131898 A1 | 5/2014 | Shearer et al. |
| 2014/0231126 A1 | 8/2014 | Hunrath et al. |

FOREIGN PATENT DOCUMENTS

| | | |
|---|---|---|
| WO | 1998039781 A1 | 9/1998 |
| WO | 1999018581 A1 | 4/1999 |
| WO | 199941019 A1 | 8/1999 |
| WO | 1999065086 A1 | 12/1999 |
| WO | 2000007267 A1 | 2/2000 |
| WO | 2000059645 A1 | 10/2000 |
| WO | 2003098745 A1 | 11/2003 |
| WO | 2008105867 A1 | 9/2008 |
| WO | 2010114874 A2 | 10/2010 |
| WO | 2010114874 A3 | 10/2010 |
| WO | 2011078918 A2 | 6/2011 |
| WO | 2011078918 A3 | 10/2011 |
| WO | 2014031358 A1 | 2/2014 |
| WO | 2014082100 A1 | 5/2014 |
| WO | 2014127381 A1 | 8/2014 |

ALTERNATIVE COMPOSITIONS FOR HIGH TEMPERATURE SOLDERING APPLICATIONS

RELATED APPLICATIONS

This application is a U.S. National Phase of PCT/US13/74497, filed Jan. 16, 2014, which claims the benefit of priority under 35 USC § 119 of U.S. Provisional Application Ser. No. 61/727,674 filed Nov. 17, 2012, the disclosures of which are incorporated by reference herein in their entireties.

FIELD OF THE INVENTION

The present invention relates to metal compositions, methods of preparation and uses therefor. More specifically, the present invention relates to metal-powder-filled TLPS paste compositions for use as solder paste replacements in step-soldering and high operating temperature applications.

BACKGROUND

High Temperature Soldering

There is a growing market for high temperature solder materials in the electronics industry. There are two main drivers for the growth of this market segment: complex electronic assemblies that require multiple assembly steps, and integration of electronics into harsh operating environments, for example, in excess of 200° C. operating temperature such as would be experienced in an automotive underhood application.

Currently these markets are being served by lead-bearing solders and expensive alloys such as gold-germanium. Lead has been banned from the majority of electronics applications in many areas of the world, but so far has been exempted in the high temperature solder applications due to the lack of an adequate replacement.

High-lead-bearing solders, in addition to their tenuous regulatory status, also suffer from some technical limitations. Although the melting temperature differential between the popular lead-free SAC (Sn/Au/Cu) alloys and lead-based solders exceeds the 30° C. desired by the industry, mixed assembly with alloys such as tin-bismuth can result in the unintentional formation of very low melting temperature alloys that compromise the reliability of the device they are used to construct. The shear strength of the high-lead alloys is typically half that of the high-tin alloys that would be used in secondary reflow. In applications in which the high-lead solder is used to attach very small components (e.g., attaching chip resistors to a package), the strength may be too low to prevent component loss during handling. Lastly, in high operating temperature applications, the melting point of these alloys may be insufficient to withstand the rigors of the operating environment.

Multi-step or step soldering, in which consecutive joints are soldered at sequentially lower temperatures, can be used to maintain the integrity of preceding joints. Such operations are commonly used in products for the consumer electronics market. However, the push to eliminate lead from this market segment is particularly strong.

There are lead-free solutions to the step-soldering dilemma, but they are not ideal. Tin-antimony solder can be used in conjunction with the popular SAC alloys, but the desirable melting temperature differential between them is less than the 30° C. desired for step soldering that would be available with lead solder/SAC systems. Alternatively, SAC alloy could be used as the initial assembly material, followed by a tin-bismuth or tin-indium alloy for the second assembly reflow step. However, such a system would not be suitable for high temperature applications because it would result in an effective maximum operating temperature of only ~100° C. Further, the secondary reflow step is typically the one in which the majority of the components are assembled to the printed circuit board (PCB) and tin-bismuth and tin-indium are neither common nor popular choices for this assembly step.

Thus there exists a need for a high operating temperature solder alternative—particularly for very high operating temperature environments (>200° C.) and a solder alternative for step soldering operations that would preserve the ability to use SAC alloys for the secondary reflow operation.

Transient Liquid Phase Sintering (TLPS)

Sintering is a process in which adjacent surfaces of metal powder particles are bonded by heating. Liquid phase sintering is a special form of sintering during which solid powder particles coexist with a liquid phase. Densification and homogenization of the mixture occur as the metals diffuse into one another and form new alloy and/or intermetallic species.

In transient liquid phase sintering (TLPS) of powders, the liquid phase only exists for a short period of time as a result of the homogenization of the metals to form a mixture of solid alloy and/or intermetallic species. The liquid phase has a very high solubility in the surrounding solid phase, thus diffusing rapidly into the solid, and eventually solidifying. Diffusional homogenization creates the final composition without the need to heat the mixture above its equilibrium melting point.

In TLPS compositions comprising powder metallurgy, a relatively low melting point (LMP) alloy and a relatively high melting point (HMP) metal are mixed in particulate form. At least one element within the alloy is either highly soluble in, or is reactive with, the receptive HMP metal. As the temperature is raised to the melting point of the LMP alloy, the alloy particles become molten. This transition can be observed as an endothermic event in differential scanning calorimetry (DSC). The reactive element(s) within the relatively low melting alloy then react with the receptive high melting point metal to form new alloy compositions and/or intermetallics. The formation of intermetallic species may be observed as an exothermic event using DSC. Thus, the typical TLPS DSC "signature" is an endotherm followed by an exotherm. The diffusion and reaction of the reactive element(s) from the low melting alloy and the receptive high melting metal continues until one of the reactants is fully depleted, there is no longer a molten phase at the process temperature, or the reaction is quenched by cooling. After cooling, subsequent temperature excursions, even beyond the original LMP alloy melt temperature, do not reproduce the original melt signature of the mixture. This is the "signature" of a typical low temperature transient liquid phase sintered metal mixture.

TLPS technology is used to produce organo-metallic conductive compositions that include HMP metal powder(s), LMP metal alloy powder(s), and a permanent adhesive-flux polymer system. TLPS compositions are employed, for example, to form conductive paths on printed circuits by creating a patterned deposition of the TLPS composition, and then simultaneously sintering the metallic components and curing the adhesive/polymer components in the composition by heating at relatively low temperature. During heating, the adhesive-flux polymer fluxes the metal powders, allowing TLPS to occur. After heating, the adhesive-flux chemically binds the resultant metal oxides, rendering them harmless. For this reason, these compositions provide good electrical conductivity with little opportunity for conductivity deterioration due to oxidation, corrosion or thermal expansion and contraction.

The microstructure of processed TLPS compositions appears as a network of particles of HMP metal, each bearing one or more "shells" of the newly formed alloy/intermetallic compositions, which are in turn interconnected by the non-reactive portion of the original LMP alloy. Open areas of the metallic network structure are generally filled with the cured polymeric binder. Reaction between the HMP metal and the reactive element(s) of the LMP alloy may result in either partial or complete incorporation of the HMP metal particles into the newly formed alloy and/or intermetallic species. The number and nature of the new alloy and/or intermetallic species that form is dependent on the selection of metallic constituents in the TLPS composition, their relative proportions, the particle size distribution and the process temperature. The composition of the residual components of the original LMP alloy is likewise dependent on these factors.

TLPS compositions are suitable replacements for conventional electrically and/or thermally conductive materials in a diverse assortment of applications, including assembly of electronic components, deposition of in-plane circuit traces, interconnection of circuit traces on different planes, assembly of unpackaged integrated circuit die onto packaging elements, and the like. For each of these applications, there is a specific set of application-specific attributes for which TLPS compositions confer an advantage over conventional materials. Attributes include, but are not limited to, ease of deposition, reduction in manufacturing time or complexity, increased circuit density in the resultant article, and production of environmentally stable interfaces that have high electrical and/or thermal conductivity.

The demands on the metallic constituents in TLPS applications are high. Some of the critical features of the metallurgy include:
  The melting point of the LMP alloy must be sufficiently low that processing of the composition does not damage the surrounding materials.
  The LMP alloy and HMP metal must form species that are good electrical and/or thermal conductors.
  The reaction products of the LMP alloy and HMP metal must be stable over the likely thermal exposure range.
  The metallic network formed by the TLPS process must be resistant to the deleterious effects of mechanical stress.
  The LMP alloy must be compatible and reactive with the metal finishes of the electronic elements to be connected.
  The primary constituent LMP and HMP metals should be readily available at a reasonable cost.
  The constituents should not be restricted due to environmental or toxicity concerns.
There remains a continuing need for improved TLPS compositions to meet these demands.

SUMMARY OF THE INVENTION

The present invention provides transient liquid phase sintering (TLPS) compositions that include: a) 30-70 percent by weight (wt %) of a low melting point (LMP) particle composition, wherein the particles are selected from the group consisting of particles of at least one LMP metal (Y), at least one alloy of the at least one LMP metal (X/Y), and combinations thereof; b) 25-65 (wt %) of a high melting point (HMP) particle composition, comprising at least one metallic element (M) that is reactive with the at least one LMP metal Y of the (LMP) particle composition at a process temperature T1, in which the HMP particle composition has an average particle size that is less than 0.5 times the average particle size of LMP particle composition c) 1-15 of a fluxing vehicle, and d) 0-40 of a metal powder additive A.

In certain embodiments, a portion of the composition melts upon heating the composition to process temperature T1, but this portion is reduced by at least 70% upon subsequent reheating to T1, due to the formation of new reaction products that do not melt at T1. Thus, in certain aspects the at least one M is present in a proportion to the at least one Y, the at least one alloy X/Y or the combination thereof that is sufficient to reduce the heat of fusion of the at least one Y or the at least one alloy X/Y or the combination thereof, by at least about 70%, at least about 75%, at least about 80%, at least about 85%, at least about 90%, or at least about 95% percent relative to the heat of fusion of the corresponding Y or X/Y after processing the TLPS composition at temperature T1

M can, for example, be selected from the group consisting of Cu, Ag, Pd, Au, Al, Ni, Be, Rh, Co, Fe, Mo, W, Mn, Pt and combinations thereof; or from the group consisting of Cu, Ag, Pd, Au, Al, Ni, Pt and combinations thereof; and in some embodiments, the at least one M is Cu. In some embodiments, the HMP particle composition includes at least two HMP metals.

Y can be, for example, selected from the group consisting of Sn, Bi, Zn, Ga, In, Te, Hg, Tl, Sb, Se, Po, Pb, Cd, Po, and combinations thereof; or from the group consisting of Sn, Bi, Pb, Ga, In, Zn and combinations thereof; and in some embodiments Y is Sn, In or a combinations Sn and In. In some embodiments, the LMP particle composition includes at least two LMP metals Y or alloys X/Y.

The metal additive A can be selected from the group consisting of Cu, Ag, In, Pd, Au, Ni, Ce, Pt or combinations thereof. In some embodiments the metal additive A comprises Be, Rh, Co, Fe, Mo, W, or Mn that has been alloyed, pseudo alloyed, or coated with a metal that can react with either M or Y.

Typically, the HMP particle composition has an average particle size less than 0.4 times, less than 0.3 times, less than 0.2 times, or less than 0.15 times the average particle size of the LMP particle composition.

The metal powder additive A, when present, has an average particle size about 0.5 to about 2.0 times the average particle size of the LMP particle composition. In some embodiments, the metal powder additive A has an average particle size about 0.5 to about 1.75 or about 0.5 to about 1.5 times times the average particle size of the LMP particle composition.

To achieve controlled particle size distributions, the particles can be hard sieved.

In certain aspects of the invention T1 is in the range of 190° C. to 400° C., 200° C. to 375° C. or 220° C. to 320° C.

DETAILED DESCRIPTION OF THE INVENTION

Figure 1:
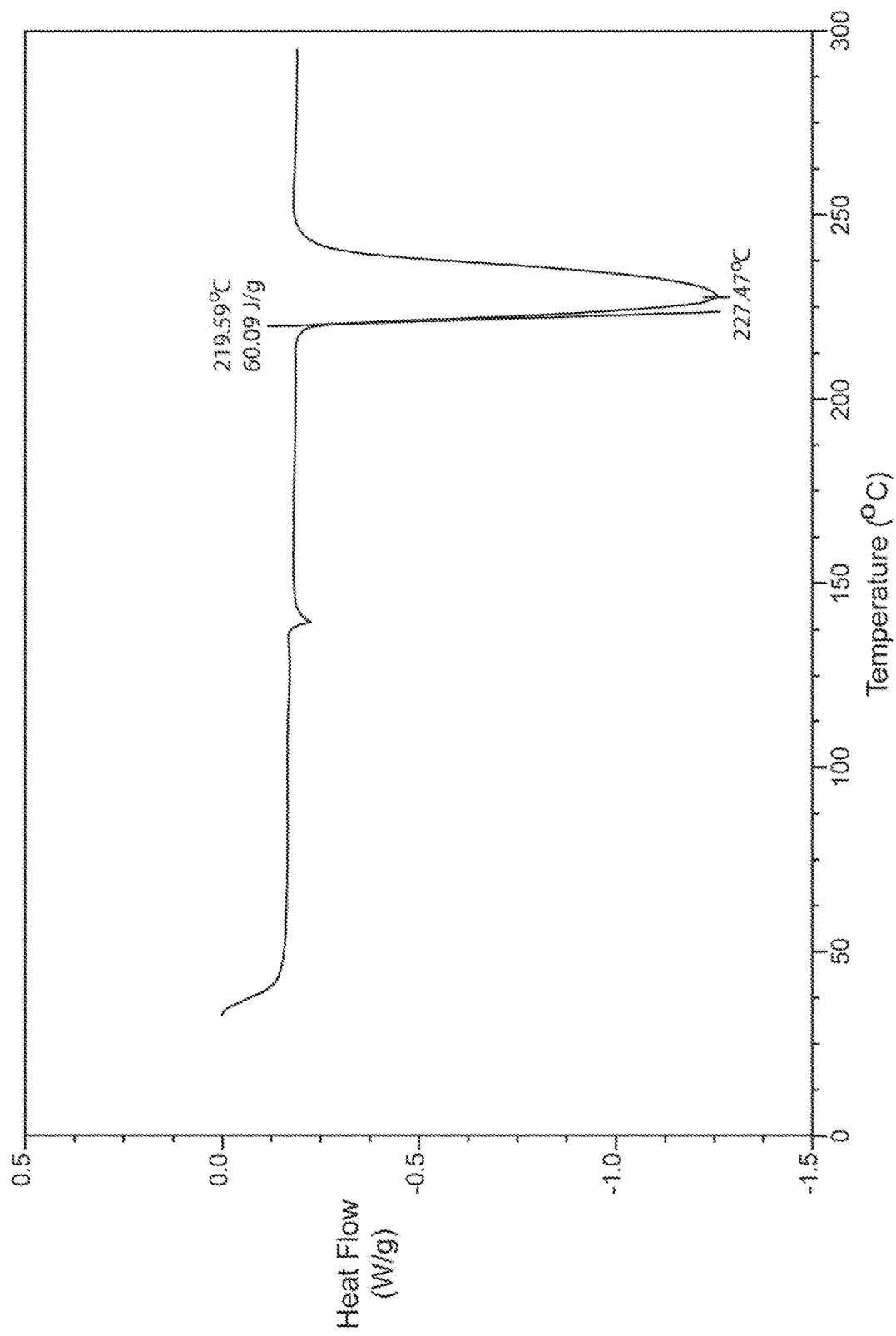
FIG. 1 shows a DSC scan showing the typical melt signature of particles of the common Sn/Ag/Cu alloy known as SAC 305. Note the single sharp endothermic peak that is characteristic of a solder alloy melt.

It is to be understood that both the foregoing general description and the following detailed description are exemplary and explanatory only and are not restrictive of the invention claimed. As used herein, the use of the singular includes the plural unless specifically stated otherwise. As used herein, "or" means "and/or" unless stated otherwise. Furthermore, use of the term "including" as well as other forms, such as "includes," and "included," is not limiting.

The section headings used herein are for organizational purposes only and are not to be construed as limiting the subject matter described.

Unless specific definitions are provided, the nomenclatures utilized in connection with, and the laboratory procedures and techniques of materials science, metallurgy, metallurgical engineering, electronics, and chemistry described herein are those known in the art. Standard chemical symbols are used interchangeably with the full names represented by such symbols. Thus, for example, the terms "Tin" and "Sn" are understood to have identical meaning. Standard techniques may be used for metallurgical processing, soldering, chemical syntheses, chemical analyses, and formulation.

Definitions

As used herein, "or" means "and/or" unless stated otherwise. Furthermore, use of the term "including" as well as other forms, such as "includes," and "included," is understood as "comprising" and is not limiting. It is to be understood that as used in the specification and in the claims, the singular form of any word can also refer to the plural, depending upon the context in which it is used. For example, "a" or "an" can mean one or more, depending upon the context in which it is used. Thus, reference to "a metal" can mean at least one metal, two metals, or a plurality of metals.

"About" or "approximately" as used herein, means that a number referred to as "about" or "approximately" comprises the recited number plus or minus 1-10% of that recited number. For example, about 50 degrees can mean 45-55 degrees or as few as 49-51 degrees depending on the situation. Whenever it appears herein, a numerical range, such as "45-55", refers to each integer in the given range; e.g., "45-55%" means that the percentage can be 45%, 46%, etc., up to and including 55%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

As used herein, the term "substantially" refers to a great extent or degree. For example, "substantially all" typically refers to at least about 90%, frequently at least about 95%, often at least 99%, and more often at least about 99.9%.

The term "alloy" refers to a mixture containing two or more metals, and optionally additional non-metals, where the elements of the alloy are fused together or dissolved into each other when molten. The notation used herein for alloy compositions lists two or more elements using their IUPAC symbols separated by a forward slash ("/"). When given, the proportions of the elements in the alloy are indicated by subscripts corresponding to the weight percent of the element in the alloy. For example, Sn/Bi represents an alloy of tin (Sn) and bismuth (Bi), which can be any proportion of these two elements. $Sn_{60}/Bi_{40}$ represents a specific alloy of tin and bismuth that contains 60 percent by weight of tin and 40 percent by weight of bismuth. Where a range is given for the weight percent of an element(s) in an alloy, the range indicates that the element can be present in any amount within the indicated range. For example, $Sn_{(70-90)}/Bi_{(10-30)}$ refers to an alloy containing from 70 weight percent to 90 weight percent of tin, and from 10 weight percent to 30 weight percent of bismuth. Thus, alloys encompassed by the "$Sn_{(70-90)}/Bi_{(10-30)}$" range include, but are not limited to: $Sn_{70}/Bi_{30}$, $Sn_{71}/Bi_{29}$, $Sn_{72}/Bi_{28}$, $Sn_{73}/Bi_{27}$, $Sn_{74}/Bi_{26}$, $Sn_{75}/Bi_{25}$, $Sn_{76}/Bi_{24}$, $Sn_{77}/Bi_{23}$, $Sn_{78}/Bi_{22}$, $Sn_{79}/Bi_{21}$, $Sn_{80}/Bi_{20}$, $Sn_{81}/Bi_{19}$, $Sn_{82}/Bi_{18}$, $Sn_{83}/Bi_{17}$, $Sn_{84}/Bi_{16}$, $Sn_{85}/Bi_{15}$, $Sn_{86}/Bi_{14}$, $Sn_{87}/Bi_{13}$, $Sn_{88}/Bi_{12}$, $Sn_{89}/Bi_{11}$, and $Sn_{90}/Bi_{10}$. Furthermore, $Sn_{(70-90)}/Bi_{(10-30)}$ represents alloys in which the specific proportion of the elements Sn and Bi may vary from $Sn_{70}/Bi_{30}$ to $Sn_{90}/Bi_{10}$ inclusive of proportions of Sn varying from 70 up to 90 weight percent and Bi inversely varying from 30 down to 10 weight percent.

The term "pseudo alloy" refers to particulates comprising a mixture of metallic elements in which the metallic elements are not dissolved into one another when in molten form. A "pseudo alloy" particle is formed by co-solidifying elements from a non-solution molten state such that each particle comprises a mixture of the co-solidified elements.

"Flux" as used herein, refers to a substance, often an acid or base, used to promote fusing of metals and in particular, removes and prevents the formation of metal oxides.

The terms "melting temperature" or "melting point," as used herein, refer to the temperature (a point) at which a solid becomes a liquid at atmospheric pressure.

The terms "high melting temperature metal", "high melting point metal" or "HMP metal" as used herein, refer to a metal having a melting temperature that is equal to, or higher than, about 400° C. HMP metals include Cu, Ag, Pd, Au, Al, Ni, Be, Rh, Co, Fe, Mo, W, Mn and Pt. Typically, the HMP metal used in the compositions of the present invention is Cu, Ag, Pd, Au, Al, Ni or Pt, and most frequently the HMP metal is either Cu or Ag.

The terms "low melting temperature metal", "low melting point metal" or "LMP metal" as used herein, refer to a metal having a melting temperature that is lower than about 400° C. Exemplary LMP metals include Sn, Bi, Zn, Ga, In, Te, Hg, Tl, Sb, Se, Po, Pb, Cd, and Po in an alloy of these metals. Typically, the LMP metal used in the compositions of the present invention is Sn, Bi, Pb, Ga, In or Zn, and most frequently the LMP is Sn in an alloy.

The term "solidus" refers to the temperature below which a given substance is completely solid (crystallized). The solidus quantifies the temperature at which melting of a substance begins, but is not necessarily melted completely, i.e., the solidus is not necessarily a melting point. For this distinction, the solidus may be contrasted to the "liquidus", which specifies the maximum temperature at which crystals can co-exist with molten substance. Above the liquidus temperature the material is homogeneous and liquid at equilibrium. Below the liquidus temperature more and more crystals may form. The solidus and liquidus temperatures do not align or overlap in all cases. If a gap exists between the solidus and liquidus temperatures, it is called the "freezing range" or "mush range", and within that gap, the substance consists of a mixture of solid and liquid phases. See e.g., FIG. 1.

The term "eutectic" refers to a mixture or an alloy in which the constituent parts are present in such proportions that the constituents melt simultaneously, and the melting point is as low as possible. Accordingly, a eutectic alloy or mixture solidifies at a single temperature. In eutectic mixtures the solidus and liquidus temperatures are identical, i.e., the mixture melts completely at one temperature, the eutectic point.

The term "non-eutectic" refers to a mixture or an alloy that does not possess eutectic properties. Accordingly, when a non-eutectic alloy solidifies, its components solidify at different temperatures, and the overall composition exhibits a melting range.

The terms "powder" or "particle" or "particulate" refers to solidified metallic constituents in discrete forms typically ranging from 1 nanometer to 100 micron in size.

The term "differential scanning calorimetry" ("DSC") refers to a method of thermal analysis in which the difference in the amount of heat required to increase the temperature of a sample and reference are measured as a function of temperature. DSC is used to investigate the melting behavior of non-eutectic alloy particles and the reaction signature of TLPS pastes formulated with eutectic vs. non-eutectic alloys.

The term "sintering" refers to a process in which adjacent surfaces of metal powder particles are bonded by heating. "Liquid phase sintering" refers to a form of sintering in which the solid powder particles coexist with a liquid phase. Densification and homogenization of the mixture occur as the metals diffuse into one another and form new alloy and/or intermetallic species.

In "transient liquid phase sintering" or "TLPS", the liquid phase exists for a only short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above the solidus temperature of the HMP metal.

"Heat of fusion" or "enthalpy of fusion" as used herein, refers to the energy required to change a substance from a solid state to a liquid state without changing its temperature. The temperature at which this occurs is the melting point. Thus, heat of fusion is a "latent heat," because during melting the introduction of heat cannot be observed as a temperature change and the temperature remains constant during the process.

"Solder" is a fusible metal alloy used to join together metal parts and having a melting point below that of the workpiece(s). Solder has a characteristic melting behavior that does not change substantially with repeated heat/cool cycles. Solder can include eutectic or non-eutectic alloys, but eutectic alloys are preferred for joining applications because the joints solidify quickly. TLPS differs from solder due to the presence of a HMP metal in TLPS compositions, which interact with a reactive LMP metal in the TLPS low melting temperature alloy to form crystalline intermetallics with specific stoichiometric proportions and much higher melting temperatures than the original TLPS composition. Thus, TLPS compositions generally do not remelt at the original process temperature. Although intermetallics can form within solder and between solder and elements in joined surfaces (e.g. copper pads), they represent only a small proportion of the soldered joint (<5%). Therefore, applied solder can be remelted under substantially the same conditions as the original application.

"Reflow" or "reflow soldering" as used herein, refer to a process which is used to temporarily attach one or several electrical components, for example to contact pads or another substrate, after which the assembly of temporarily attached components and substrate/contact pads is subjected to controlled heat sufficient to cause the solder to melt, flow, and solidify, forming a permanent electro-mechanical bond between the parts and solder.

The terms "ductility" or "ductile" refer to a solid material's ability to deform under tensile stress; this is typically characterized by the material's ability to be stretched, e.g. into a wire. A similar, but distinguishable property of a solid material is "malleability" which is a material's ability to deform under compressive stress and is characterized by the material's ability to form a thin sheet by hammering or rolling.

The "Coefficient of Thermal Expansion" or "CTE" is a term of art describing a thermodynamic property of a substance. The CTE relates a change in temperature to the change in a material's linear dimensions. As used herein "$\alpha_1$ CTE" or "$\alpha_1$," refers to the CTE before the $T_g$, while "$\alpha_2$ CTE" refers to the CTE after the $T_g$.

The term "processing temperature" or "T1" as used herein in reference to TLPS compositions is a temperature at which two reactive metals (e.g. Cu and Sn) form intermetallic species.

The terms "intermetallics" or "intermetallic species" refer to a solid material, which is comprised of two or more metal atoms in a certain proportion, that has a definite structure which differs from those of its constituent metals.

Compositions of the Invention

The present invention provides transient liquid phase sintering (TLPS) compositions for connecting a variety of electronic parts for applications where high operating temperatures may be encountered, including but not limited to step-soldering, down-hole, oil drilling. electronic controls, automotive underhood, smart-grid distribution, and aerospace applications. Previous applications have described various TLPS combinations, formulae and ratios of HMP and LMP metal particles including: U.S. Pat. No. 8,221,518 entitled "CONDUCTIVE COMPOSITIONS CONTAINING BLENDED ALLOY FILLERS"; U.S. Patent Publication No. 2011-0171372 entitled "PREPARATION OF METALLURGIC NETWORK COMPOSITIONS AND METHODS OF USE THEREOF"; U.S. patent application Ser. No. 13/843,555, filed Mar. 15, 2013 entitled "CONDUCTIVE FILM ADHESIVE"; U.S. patent application Ser. No. 13/732,308, filed Dec. 31, 2012 entitled "ELECTRICALLY CONDUCTIVE COMPOSITIONS COMPRISING NON-EUTECTIC SOLDER ALLOYS"; and U.S. patent application Ser. No. 13/906,317, filed May 30, 2013 entitled "ALTERNATIVE COMPOSITIONS FOR HIGH TEMPERATURE SOLDERING APPLICATIONS, the contents of each of which are incorporated herein by reference in their entireties.

The compositions of the present invention are advantageously used to connect electronic components to leads, circuit boards, lead frames or other substrates. Invention compositions are most advantageously used to connect electronic components when the assemblies thus connected will be subjected to a subsequent assembly operation that requires another solder reflow and/or when the assembly will be used in a harsh operating environment.

In certain embodiments, the present invention provides TLPS compositions that include the following components:
A. A solder alloy powder;
B. A reactive metal powder having the following properties:
  (1) it includes at least one metallic element that is capable of forming crystalline intermetallics with at least one element in the solder alloy;
  (2) it has an average particle size that is less than 0.5 times the average particle size of the solder alloy powder; and
  (3) it is present in proportion with the solder alloy powder such that the heat of fusion of the composition at the solder alloy melting temperature is reduced by at least 70% following a solder reflow cycle as compared to the heat of fusion of the composition prior to reflow;
C. A fluxing vehicle; and
D. Optionally, a metal powder additive for refinement of the mechanical characteristics of the processed composition.

In the practice of certain embodiments of the invention, components A-D are mixed together to form a printable paste. Typically, the solder alloy powder will be present in an amount that is about 30-70 weight percentage (wt %) of the mixture; the metal powder will constitute from 25-65 wt % of the mixture; the fluxing vehicle will constitute up to 15 wt % of the mixture; and the metal powder additive will present at 0-40 wt % of the mixture.

In the instant invention, TLPS methodology is employed by admixing small particles of a reactive metal with the solder alloy particles in a fluxing vehicle. At least one element within the solder alloy powder is reactive with the metal in the small metal particles. As the temperature is raised to the melting point of the solder alloy, the particles become molten. This transition can be observed as an endothermic event in differential scanning calorimetry (DSC). The reactive element(s) within the solder alloy then react with the receptive, small metal particles to form new alloy compositions and intermetallics. The formation of intermetallic species may be observed as an exothermic event using DSC. The diffusion and reaction of the reactive element(s) from the low melting alloy and the receptive metal particles continues until the reactants are fully depleted, there is no longer a molten phase at the process temperature, or the reaction is quenched by cooling the mixture. After cooling, subsequent temperature excursions, even beyond the original melt temperatures, do not reproduce the original melt signature of the mixture. This is the signature of a typical low temperature transient liquid phase sintered (TLPS) metal mixture.

In one embodiment of the invention, TLPS compositions are provided that include at least one first particle comprising at least one high-melting-point (HMP) metal (M); and at least one second particle that includes a low-melting-point (LMP) metal Y and/or an alloy of the LMP metallic element (X/Y) that is reactive with M. The compositions can contain only a single type of HMP particle (i.e., containing only one high melting point metal M or more than one type (e.g., containing different high melting point metals, or particles of different sizes, shapes etc.). Similarly, the composition can contain a single type of LMP particle Y or multiple types, which can include various alloy compositions X/Y, additional elements, coatings, sizes, shapes and the like. Optional metal particle additive A may be added to improve the mechanical characteristics of the processed invention composition.

Thermosetting Properties of TLPS Compositions

The compositions of the present invention are based on the observation that TLPS compositions can be processed at a temperature, T1, to connect electronic components and the resulting processed connections will be stable upon subsequent heating to temperature T1 and even higher temperatures. In other words, once metallurgically processed, TLPS compositions do not melt when heated beyond the process temperature. Thus, the TLPS compositions behave like "thermosets", rather than "thermoplastics".

The skilled artisan will recognize that "thermosets" irreversibly "cure" upon application of heat to become insoluble, hardened forms, while "thermoplastics" melt when heated, solidify when sufficiently cooled and can be remelted and resolidified repeatedly. Although this terminology is typically used to describe polymer adhesives, it is used herein to describe metallurgical compositions used to connect, for example, electronic components and other metallic elements.

Conventional metallic solder can be characterized as "thermoplastic". Solder is melted to join metal parts together and solidifies upon cooling to hold those parts in place; yet when subsequently re-heated, solder re-melts. In contrast, TLPS compositions behave like thermosets. When heated, TLPS compositions melt sufficiently to join metal parts together, and solidify upon cooling to hold those parts in place. However, during the melting process, TLPS compositions undergo irreversible metallurgical changes that can be considered "curing" with the result that the "cured" or processed TLPS composition will not melt upon re-heating.

In certain embodiments of the invention, conventional solder pastes containing low melting point (LMP) metal alloys, are combined with small reactive metal particles in proportions that convert the solder to a "thermosetting" form, which irreversibly "cures" during a typical solder reflow cycle. This "thermosetting" behavior results in a joint that does not remelt at the original reflow temperature and thus is suitable for secondary assembly cycles at the same reflow temperature as well as for high operating temperature applications.

In conventional solder reflow, the reflow temperature is typically selected to be 5-50° C. in excess of the melting temperature of the solder paste to ensure that all the particles become molten and fluid. When invention compositions are used in place of solder paste for the attachment of electronic components, standard solder reflow practices may be followed.

In standard TLPS powder metallurgy, a relatively low melting point (LMP) metal alloy and a relatively high melting point (HMP) metal are mixed in particulate form. At least one element within the LMP alloy is reactive with the HMP metal. As the temperature is raised to the processing temperature, the LMP alloy particle types become molten. The reactive element(s) within the LMP alloy then react with the receptive HMP metal to form intermetallics, and the residual LMP alloy constituents form new alloy compositions. The diffusion and reaction of the reactive element from the LMP alloy and the receptive HMP metal continues until at least one of the reactants is either fully depleted, there is no longer a molten phase at the process temperature, or the reaction is quenched by cooling the mixture.

Phase diagrams for other common alloy systems can be viewed on the world wide web at metallurgy.nist.gov/phase/solder/solder.html.

In the practice of the invention, the at least one high-melting-point metal M, and at least one LMP metal Y and/or at least one alloy thereof X/Y, are selected so that the products of the transient liquid phase sintering reaction will have the optimum combination of attributes for the intended application. Key attributes that may be contemplated for the selection of M encompass characteristics such as thermally stable resistance, ductility, high electrical and thermal conductivity, coefficients of thermal expansion similar to the surrounding materials, and others that may be desirable under specific circumstances.

The invention compositions undergo a thermosetting reaction under solder reflow conditions to form a mixture of crystalline intermetallic and alloy products (i.e., new alloys formed during TLPS reaction) that all have substantially higher melting temperatures than the initial solder alloy powder melt temperature, and vastly in excess of reflow processing temperatures. The alloy products formed during TLPS processing have a substantially different composition than the original solder alloy particles. This reaction is irreversible and the processed composition does not melt significantly during subsequent high temperature exposures. It is this feature that enables invention compositions to be used for standard reflow attachment of electronic components without remelting during subsequent reflow operations. Invention compositions, therefore, enable step soldering operations and high operating temperature electronic assemblies to be fabricated under standard industry solder reflow conditions without the use of lead, expensive elements such as gold, or exotic alloys.

The crystalline intermetallics that are formed during solder reflow using invention compositions comprise unit cells of fixed elemental proportions and structure in a multiplicity that defines a grain size. Crystalline intermetallics are strong, but brittle materials. When intermetallics are formed at the interface between a standard solder paste and a components attachment pad, large grains are typically grown with laminar interfaces with the pad and bulk solder. These laminar interfaces are susceptible to crack formation and propagation. With invention compositions; however, the small size of the reactive metal powder nucleates a large multiplicity of small disordered grains in different orientations. The growth of this multiplicity of grains is limited by the volume of reactive metal in each particle. The random orientation of each grain prevents the small grains from merging into a few large grains. This multiplicity of small, disordered grains promotes the formation of a strong joint that is not as susceptible to crack propagation as would a few large grains along a laminar interface.

Figure 2:
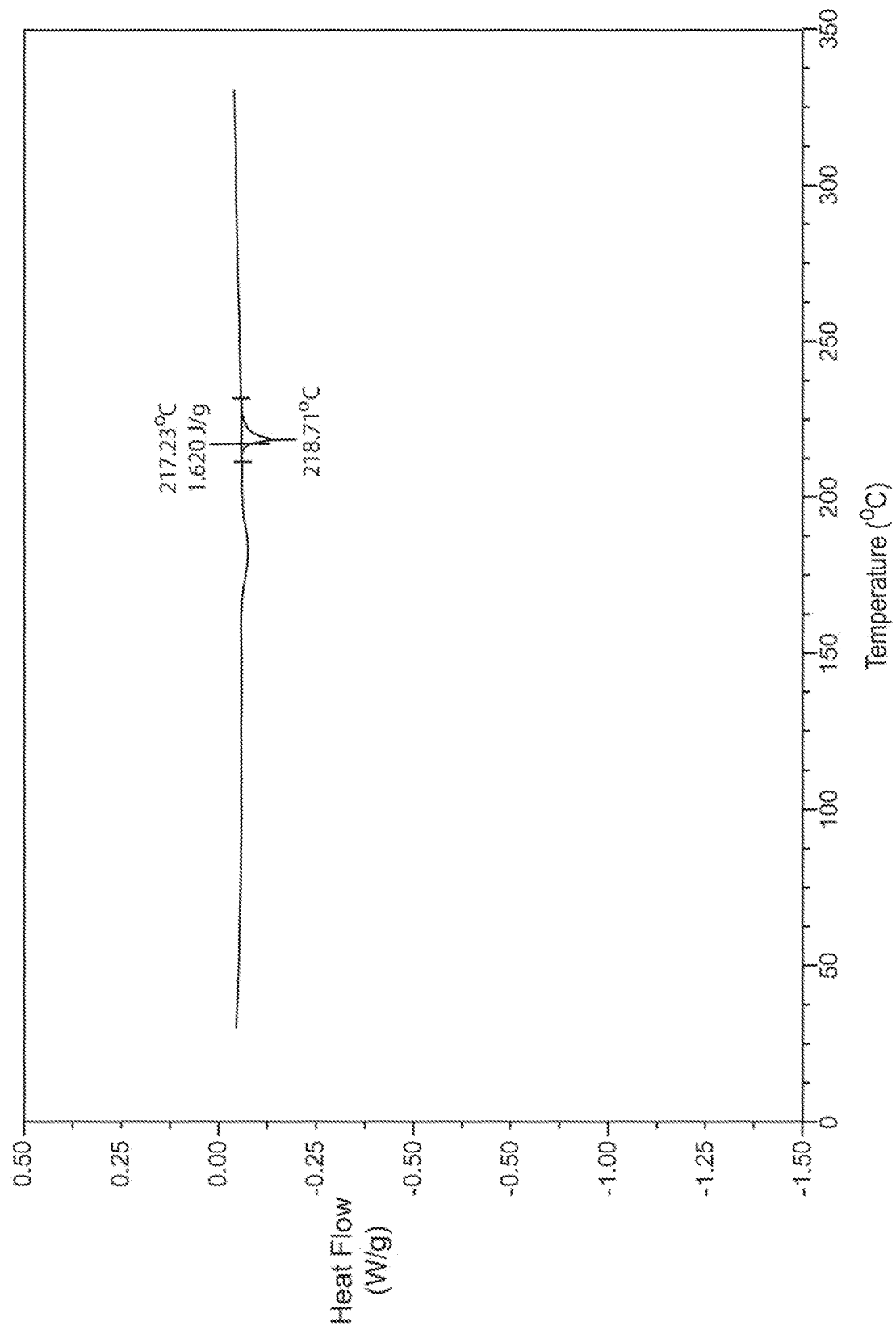
FIG. 2 shows a DSC scan of invention composition comprising SAC 305 alloy particles and Cu particles after a reflow process. Note the substantial reduction in melt energy of the SAC 305 alloy in comparison to FIG. 1.

Typically, the heat of fusion of the invention composition at the solder alloy melting temperature is reduced by at least 70% during the initial solder reflow process. This property is illustrated in FIGS. 1 and 2. During initial processing, the TLPS composition exhibits a significant heat of fusion peak at the melting temperature of the SAC solder alloy component. See FIG. 1. After processing, the heat of fusion upon reheating to the melting temperature of the alloy is reduced substantially even when normalized for the proportion in the total composition. Compare FIG. 2.

The energy required to change a gram of a substance from the solid to the liquid state without changing its temperature is called heat of fusion. The heat of fusion for any material is specific to that material. The expression of heat of fusion of the LMP metal Y within a TLPS composition will be dependent on the proportion of the LMP metal Y in the total composition. The depletion of the LMP metal Y phase in any given TLPS composition after processing, due to the reaction of M and Y to form intermetallic species, may be determined by comparing the heat of fusion of a sample of the unprocessed composition to that of one that has been processed at T1. Because the heat of fusion of the LMP metal Y in the unprocessed composition may be masked by the vigorous energy release associated with the TLPS reaction of X and M, it is often useful to use the heat of fusion of pure LMP metal Y (as in FIG. 1) and then normalize this value according to the weight percentage of LMP metal Y in the composition to obtain a value for the unprocessed TLPS composition.

High Melting Point Metal

HMP metals (M) include, but are not limited to, Cu, Ag, Pd, Au, Al, Ni, Be, Rh, Co, Fe, Mo, W, Mn and Pt. Typically, the HMP metal used in the compositions of the present invention is Cu, Ag, Pd, Au, Al, Ni or Pt, and most frequently the HMP metal is either Cu or Ag. The HMP particles comprising M may be substantially elemental M, may be M alloyed with other elements, may be M coated onto a non-metallic or other core particle, or may be M coated itself with another element, inorganic coating or organic coating. The use of multiple HMP metals is contemplated in order to obtain TLPS reaction products with optimal characteristics. For instance, in some applications the mechanical strength of the processed composition is less important than the electrical conductivity, or the thermal conductivity may be more important than the ductility. As it is often necessary to optimize one property at the expense of another, the individual constituents may be selected to give optimal performance in the intended application according to properties of the elements that are well-known in the art. Silver, gold, palladium, nickel and aluminum are specifically contemplated for use in the compositions and methods of the invention, either alone or in various combinations, including combinations with copper.

Low Melting Point Metal

Ideally, to substitute in existing lead-free solder reflow processing in use by the electronics industry, the LMP metal (Y) or alloy (X/Y) used in the TLPS compositions of the invention is one that is commonly used in the fabrication of lead-free solder pastes. Exemplary solder paste alloys (Y/X) include, but are not limited to, Sn/Ag/Cu, Sn/Cu, Sn/Ag, Sn/Sb, Sn/In, Sn/Bi, Sn/Bi/Ag. While it is advantageous to use commercially available alloys, the invention can be practiced with any suitable alloy. The exact proportions of the constituents may vary and custom alloys are contemplated by the invention. In the representation "Y/X" for the solder alloy, "X" represents at least one metal that forms an alloy with Y. In some embodiments of the invention, λ represents one, two, three or more alloying metals. For example, Y/X is used herein to represent various alloys of Y in where Y is tin, and λ is a single metal, for example, copper (Sn/Cu), silver (Sn/Ag), antimony (Sn/Sb), indium (Sn/In), and bismuth (Sn/Bi). Y/X is also used to represent various alloys of Y is tin and X represents two metals, such as silver and copper (Sn/Ag/Cu; e.g., SAC), and silver and bismuth (Sn/Bi/Ag).

Exemplary LMP metals (Y) include the following metals: Sn, Bi, Zn, Ga, In, Te, Hg, Tl, Sb, Se, Pb, Cd, and Po alone or in an alloy form. Typically, Y in the compositions of the present invention is Sn, Bi, Pb, Ga, In or Zn, and most frequently the Y is Sn in an alloy form X/Y. In certain embodiments of the invention, the reactive metal Y is Sn, which is present in the form of a low melting temperature alloy X/Y, and the reactive HMP metal M is Cu or Ag. In one embodiment of the invention, X/Y is SAC (Sn/Ag/Cu) and M is Cu.

Metal Additives

Aspects of the invention are based on the observation that inclusion of a metal additive can improve the properties of processed TLPS compositions, such as ductility. Thus in certain embodiments of the invention, beneficial metal additives (A) are incorporated into the TLPS metallurgy via blending of additive elemental or alloy powders with the predominant metal M and Y or alloy powder X/Y constituents described above. Such metal additives A participate in the invention metallurgy, either as inherently reactive constituents or as constituents made reactive by coating, alloying or pseudo alloying with a reactive metal element. Additive metals include Cu, Ag, In, Pd, Au, Ni, Ce and Pt. Other metals such as Be, Rh, Co, Fe, Mo, W, and Mn are also contemplated as additives if alloyed, pseudo alloyed, or coated with a metal that can react with either M or Y.

Figure 3:
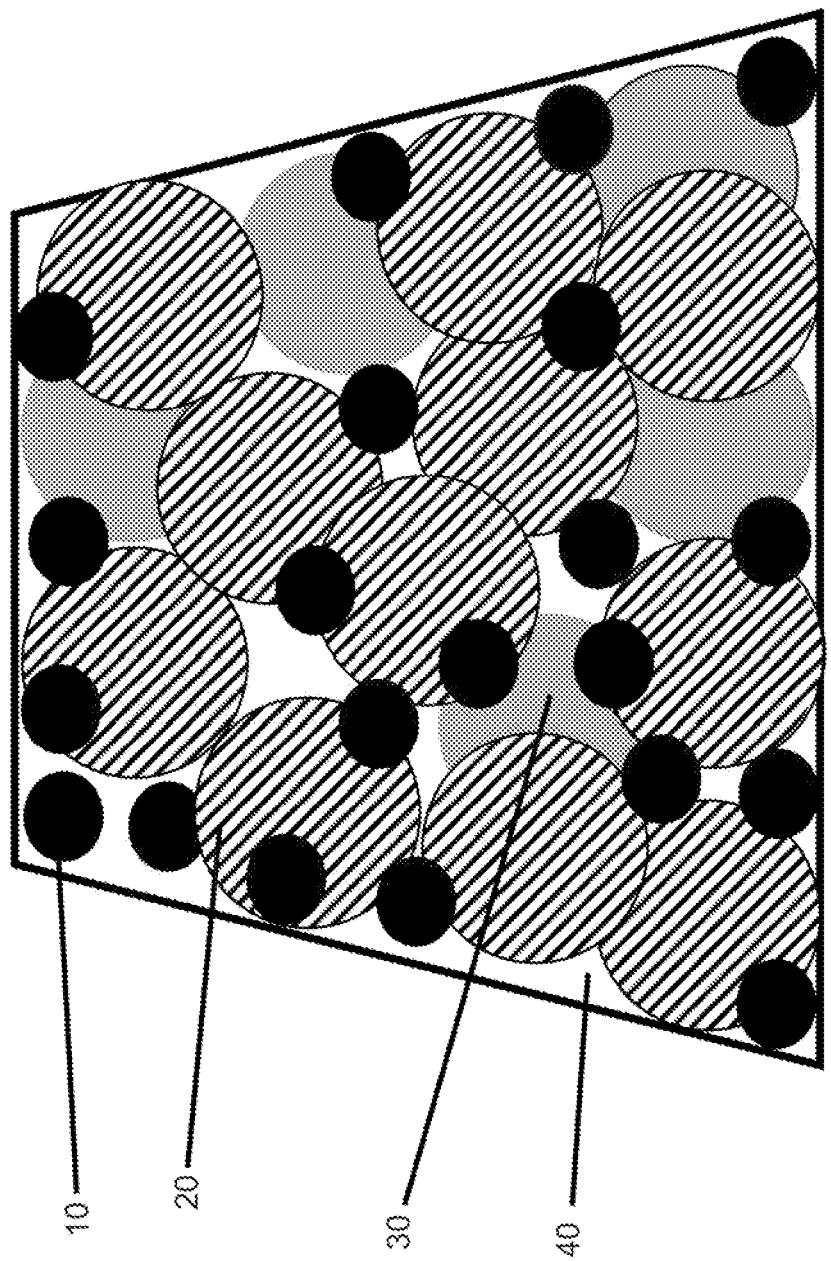
FIG. 3 is a conceptual diagram of one embodiment of the invention composition. In the figure, 10 represents the HMP metal M, 20 represents the LMP metallic element or alloy Y, 30 represents optional metal additive A, and 40 represents the fluxing vehicle in an unreacted composition.
Figure 4:
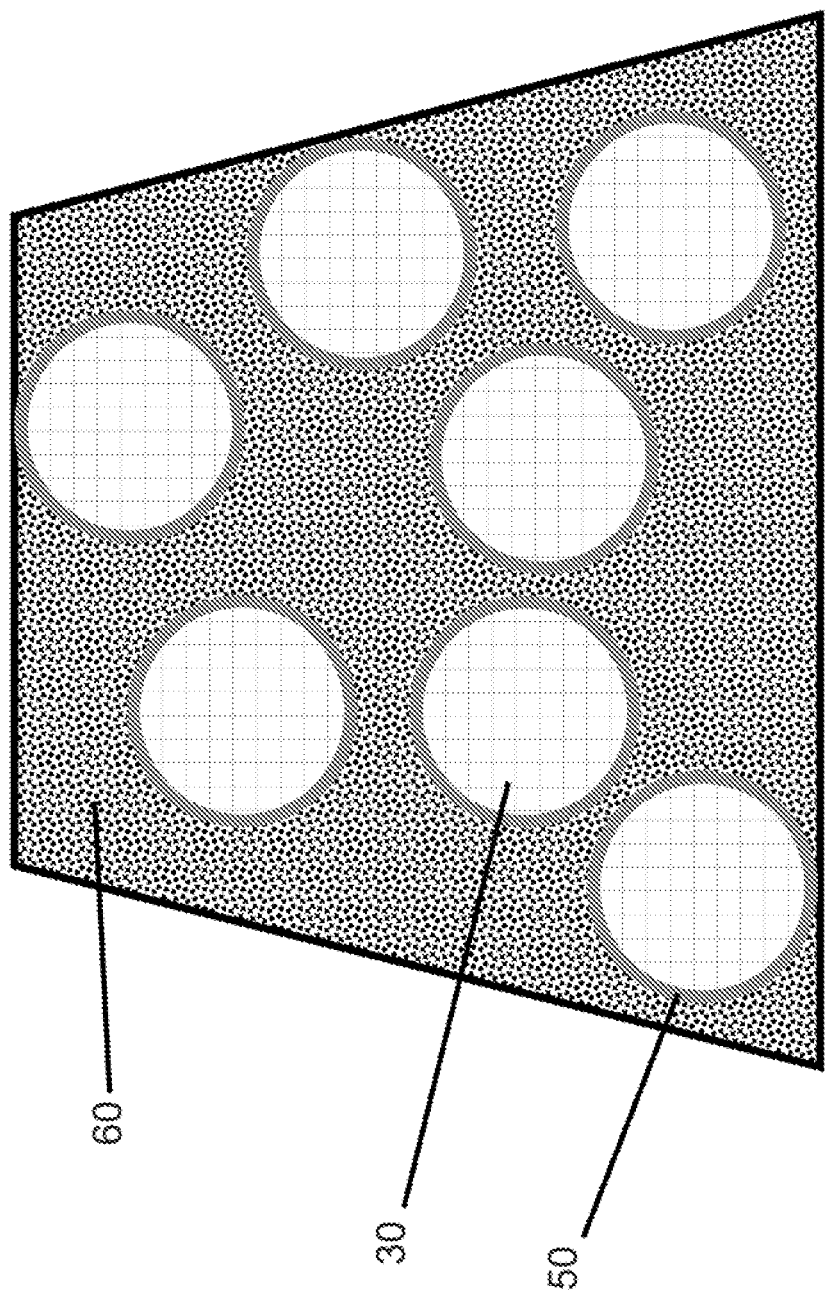
FIG. 4 is a conceptual diagram of the composition of FIG. 3 after processing at a solder reflow temperature T1. In the figure, 30 represents the residual metal additive A, 50 represents the reaction product of A with either or both Y and/or M, 60 represents the reaction products of Y and M mixed with the byproducts from alloying constituents, when present, in the HMP and LMP alloys.

When present, a primary purpose of the additive metal particle A is to provide a ductile phase within the matrix of crystalline intermetallic reaction products formed by reaction of M and Y upon processing the TLPS compositions of the invention. See FIGS. 3 and 4, which show a conceptual illustration of a particle composition of the invention that includes additive metal particle A before (FIG. 3) and after (FIG. 4) processing at T1. In order to be effective in improving the ductility of the overall composition, the additive particle A must be metallurgically bonded into the matrix. If A is not bonded into the matrix, a crack that forms and propagates through the brittle crystalline phases (e.g., intermetallic) will merely circumvent the ductile additive particle A rather than reaping the benefit of the more ductile phase. However, when additive particle A is bonded to the matrix, the increased ductility imparted by the additive ductile phase mediates crack propagation and allows the joint to withstand increased mechanical strain.

In certain embodiments of the invention, partial re-melting of the invention composition after reflow is not detrimental, for instance when there is little mechanical load on the TLPS joint in a secondary reflow operation. In such applications, an excess of the element Y or alloy X/Y may be incorporated to provide a ductile phase. Ductility may also be imparted by an element that is alloyed with Y in a LMP alloy X/Y, whereby the ductile phase is made available when Y is depleted by reaction with M. On the other hand, ductility may not be necessary for use of the invention compositions in certain applications, such as where the mechanical forces operating on the TLPS joint of the reflow invention composition are not along grain boundaries. Therefore, the incorporation of metal additive A is optional and the level of incorporation will vary from 0-40% by weight in the invention compositions.

When incorporation of a ductile phase other than an excess of the element Y or alloy X/Y is desirable, there are at least two means of incorporation. The first method is to incorporate one or more HMP metal(s) in a bimodal particle size distribution (i.e., small and large particles containing the HMP metal). The smaller particles of HMP metal serve as the HMP metal M TLPS reagent that reacts with Y, while the larger particles of HMP metal are too large to be effectively converted to intermetallic species. Therefore, larger particle size of HMP metal that function as metal additives A reacts only on the particle surface while the bulk remains unreacted, ductile metal. The two sizes of HMP metal particles may be the same or different HMP metals. As discussed below, in some embodiments, the large HMP metal additive particles A are typically about the same size as the LMP Y or alloy X/Y particles, and thus are twice the size times the size of the smaller HMP metal particles M.

The second method for creating a ductile phase is to incorporate into the invention compositions a ductile metal that is not reactive with Y or M, but is coated, alloyed or pseudo alloyed with a reactive metal as metal additive A particles. In this alternative, the reactive metal that is coated, alloyed, or pseudo alloyed reacts into the matrix metallurgically, leaving the ductile metal intact to form a ductile phase.

Particle Size, Shape and Ratios

High-melting-point metal M, the metal Y or alloy X/Y, and optional metal additive A are introduced into the composition as particles (e.g. powders). The particles may be spherical, irregular, flakes, spongiform, rods and other forms known to those of skill in the art. The particles of HMP metal M, may be substantially elemental, may be alloyed with other elements, may be deposited onto a non-metallic or other core particle as a coating, or may itself be coated with another element, inorganic coating or organic coating. Likewise, LMP metal Y or alloy comprising X/Y may be a binary alloy consisting exclusively of a metallic element X and reactive, LMP metallic element Y, or may be alloyed with other constituents, may be deposited onto a non-metallic or other core particle as a coating, or may itself be coated with another element, inorganic coating or organic coating.

A critical feature of the invention is the high strength of the invention compositions that makes them suitable for mechanical joining operations. The particles, such as powders, of HMP metal M, and the LMP metal Y or alloy X/Y typically have a nominal diameter between about 0.1 μm up to about 100 μm. The inventor has observed that the use of HMP metal powder M in which the average particle diameter is 0.50 times or less than the average diameter of LMP metal Y or alloy X/Y substantially improves the strength of the joint formed from thermal processing (data not shown). It has also been noted by the inventor that the ductility improvement imparted by metal additive A is most effective when the average diameter of particles of A is substantially the same as the average diameter of particles of LMP metal Y or alloy comprising X/Y (data not shown).

In some embodiments, two or more sizes of particles are present in the TLPS compositions, including a variety of particles sizes and particle mixtures that include particles throughout the range of about 1 nm to about 100 μm, about 10 nm to about 100 μm, about 100 nm to about 75 μm, about 1 μm up to about 75 μm, and about 1 μm to about 50 μm. In some instances, strict control of the particle size distribution, generally achieved through hard sieving, can be used to render the TLPS compositions of the invention suitable for deposition techniques such as dispensing, ink jetting and the like. Typically the average particle size of LMP metal Y or alloy X/Y is 15-50 micron; most often it is in the range of 20-40 micron.

In certain embodiments the average particle size of HMP metal M is about 0.05 to about 0.5 times, typically, about 0.1 to about 0.4 times and most often, about 0.15 to about 0.3 times the average particle size of LMP metal Y or alloy X/Y.

In certain embodiments the average particle size of metal additive A is 0.5-2.0 times the average particle size of LMP metal Y or alloy X/Y; typically, the range is about 0.5 to about 1.5; and frequently about the same size as LMP metal Y or alloy X/Y.

Generally, the HMP metal M and LMP metal Y or alloy X/Y are provided in the formulated compositions of the invention in the weight proportion (M:Y or M:X/Y) of about 1:10 to about 10:1. In certain compositions according to the invention, the proportion is about 1:5 to about 5:1. In other formulations, the proportion is about 1:3 to about 3:1, or about 1:2 to about 2:1. In certain aspects, the proportion of particles comprising M to particles comprising Y is about 1:1.5 to about 1.5:1.

The constituents of nine exemplary TLPS compositions (#1-9) according to embodiments of the invention are given below in Table 1.

TABLE 1

| # | HMP Metal (M) (wt %) | LMP Metal (Y) or Alloy (X/Y) (wt %) | Metal Additive (A) (wt %) | Organic Vehicle (wt %) | Total (wt %) |
|---|---|---|---|---|---|
| 1 | Cu powder, 25-65 | Sn powder, 30-70 | Cu, 0-40 | 1-15 | 100 |
| 2 | Cu powder, 25-65 | $Sn_{96.5}/Ag_{3.5}$ powder, 30-70 | Ni, 0-40 | 1-15 | 100 |
| 3 | Cu powder, 25-65 | $Sn_{96.5}/Ag_{3.0}/Cu_{0.5}$ powder, 30-70 | Cu, 0-40 | 1-15 | 100 |
| 4 | Cu powder, 25-65 | $Sn_{99.3}/Cu_{0.7}$ powder, 30-70 | In, 0-40 | 1-15 | 100 |
| 5 | Ag powder, 25-65 | Sn powder, 30-70 | Ag-coated W, 0-40 | 1-15 | 100 |
| 6 | Ag powder, 25-65 | $Sn_{96.5}/Ag_{3.5}$ powder, 30-70 | Mo/Cu pseudo alloy, 0-40 | 1-15 | 100 |
| 7 | Ag powder, 25-65 | $Sn_{96.5}/Ag_{3.0}/Cu_{0.5}$ powder, 30-70 | Cu, 0-40 | 1-15 | 100 |
| 8 | Ni powder, 25-65 | $Sn_{96.5}/Ag_{3.0}/Cu_{0.5}$ powder, 30-70 | Ag, 0-40 | 1-15 | 100 |
| 9 | Cu powder, 20-80 | $Sn_{48}/In_{52}$ powder, 20-80 | Ni, 0-40 | 1-15 | 100 |

Methods of Making High Temperature Solder/TLPS Compositions

The present invention also provides methods for preparing the TLPS compositions described herein by providing at least one HMP metal M in particulate form, at least one low-melting-temperature alloy X/Y in particulate form, and an organic vehicle; and combining the particles and organic vehicle in the following proportions, based on the total weight of the composition:

between about 25 wt % and about 65 wt % of HMP metal powder comprising M;

between about 30 wt % and about 70 wt % of LMP metal Y and/or alloy X/Y;

between about 0% and about 40 wt % of metal powder additive A; and between about 1% and about 15 wt % of the organic vehicle.

The present invention also provides methods for preparing the TLPS composition disclosed herein, including the steps of:
1. providing at the least one HMP metal M in particulate form, at least one LMP metal Y and/or alloy X/Y in particulate form, an organic vehicle, and optionally, one or more metal additive A in particulate form; and
2. combining the particles and organic vehicle in the following proportions, based on the total weight of the composition:
   (a) between about 25 wt % and about 65 wt % of at the least one HMP metal M in particulate form;
   (b) between about 30 wt % and about 70 wt % of the least the at least one LMP metal Y and/or alloy X/Y in particulate form;
   (c) between about 1% and about 15 wt % of the organic vehicle; and between 0 wt % and 40 wt % the metal particle additive A, thereby preparing the TLPS composition.

The alloys contemplated for the TLPS compositions of the invention are generally available commercially.

Particle Coatings

Coatings may be present on either or both of the first and second particles, comprising M and Y, respectively, and/or on optional metal powder additive A. Coatings contemplated for use include metals, inorganic coatings, organic coatings and organo-metallic coatings. Preparing the particles with a coating can be used, for example, to introduce an additional metallic element into the TLPS compositions of the invention in order to alter the properties of the processed metallic matrix, protect the particles from oxidation, prevent the metals or metal oxides from premature reaction with the organic constituents, facilitate dispersion of the particles in the matrix, maintain the particles in suspension, impart lubricity to the composition, prevent agglomeration of the particles, and the like. The particular selection of the presence and type of coating is dependent on the application contemplated for the TLPS composition, the method of deposition and the chemistry of the organic vehicle—all of which are within the knowledge of the skilled artisan. Metals (such as tin and silver), phosphorous containing moieties such as self-assembling phosphonate monolayers, saturated and unsaturated fatty acids, inorganic and organic metal salts, metal alkoxides, triazoles, and polyaniline are all specifically contemplated as components of useful coatings according to the present invention.

Organic Vehicles

The organic vehicle for the TLPS composition may simply be a carrier for the metallic particles, serving to hold the mixture together for easy of application and to keep the various particles in close proximity to each other. More typically, the organic vehicle provides a flux activity, particularly when a HMP metal of the composition is a non-noble metal, and may provide a mechanism for self-inerting the flux during applications in which there is no opportunity for the flux to be driven off during processing. The organic vehicle may further include thermoplastic polymer materials that allow the TLPS composition to be shaped as desired prior to processing, and may contain polymer precursors and/or other compounds and solvents that react to form an interpenetrating matrix with the metallic network during processing.

The organic vehicle of the invention composition typically serves to make the metallic reagents available for reaction and to protect them from the environment, much as a solvent does in an organic reaction. Several factors determine the selection of an appropriate solvent for an organic reaction (e.g. polarity, protic or aprotic, miscibility with water, etc.). Likewise, the organic vehicle in the compositions of the present invention is selected for appropriate attributes. Often, a critical attribute of the organic vehicle is removes the metallic oxides from the surfaces of the metallic reagents to make the reagents available for reaction. Removal of the metallic oxides is referred to as "fluxing" and may be accomplished by a variety of chemical species known to those of skill in the art, including organic acids and strong bases. Other attributes of the organic vehicle are selected on an application-specific basis. For instance, in an application in which invention metallic compositions are employed as a solder paste replacement, the entire organic vehicle may be formulated to volatilize during processing. In applications in which invention metallic compositions are employed in adherent coatings on nonmetallic surfaces, the organic vehicle may be selected for adhesive properties. Therefore, aside from the necessity for a fluxing component, the organic vehicle may include a wide variety of organic constituents that are well known in the art.

The constituents of the organic vehicle may be selected by those having ordinary skill in the art in accordance with the requirements of the application to meet specific deposition, processing, adhesion or other performance characteristics. In some embodiments, the organic vehicle may be comprised of a combination of a flux and a resin. Those skilled in the art can select both the flux and the resin from the products commonly used for these purposes. As a non-limiting example, an epoxy material may be used as a resin.

The organic vehicle will generally comprise about 1 to 15 weight percent (wt %), typically, about 1-15; often about 5-15 wt %, and most frequently, about 5-10 wt % of the TLPS composition. This percentage is typically inclusive of any diluent used to achieve a consistency suitable for application techniques such as dispensing, screen printing, stencil printing and the like.

Applications of Inventive TLPS Compositions

The metallurgical networks formed from the TLPS compositions of the invention are useful for electrically, thermally and/or mechanically connecting elements within electrical structures. Exemplary applications in which inventive compositions may be used include connecting semiconductor dies to packaging elements; connecting packaged semiconductor components to printed circuit boards; connecting other discrete components to electronic substrates; attaching discrete components to leads; forming connections between stacked die; forming circuit traces; filling holes in electronic substrates; interconnecting circuit layers in printed circuit boards and/or semiconductor packages; forming collection grids for solar panels; forming electrically conductive pillars, cylinders or columns; to electrically interconnecting electrical subsystems through interposer structures, and the like.

The TLPS compositions of the invention can be applied using various techniques, including, but not limited to, needle dispensing, stenciling, screen printing, ink jetting, extrusion, casting, spraying and other methods that will be known to those of skill in the art, such as methods that form patterned deposits to which electronic components may then be attached.

After deposition, metallic components (e.g., electronic components) are contacted with the deposited invention composition to form an assembly. Any solvents present in the composition are evolved at mildly elevated temperature, typically in the range of 60-150° C., and then the assembly is thermally processed by raising it to a temperature in excess of the melting temperature of the solder alloy powder (e.g., alloy X/Y) and/or LMP metal Y powder.

The compositions of the invention can be thermally processed in an oven, in a reflow furnace, in thermocompression equipment, on a hot plate, in a lamination press, or by any other available means, such as means typically employed for the processing of solder or filled organic adhesives. The skilled artisan will be aware of additional methods that are typically employed for the processing of solder or filled organic adhesives that will be suitable for processing the TLPS compositions described herein. The specific thermal process conditions are dependent upon the application, intended use, the TLPS composition and any organic binder constituents.

Methods of Forming Connections Using Invention Compositions

Also provided by the invention are methods of forming a mechanical connection, a conductive connection, an electrical connection, a conductive circuit and the like, in an electrical assembly by applying a TLPS composition disclosed herein to at least one element of an electronic assembly, and heating the element to a process temperature, T1, such that the high melting point metal M forms intermetallic species with the reactive, low melting point metal Y, thereby forming a connection or circuit in the electrical assembly. The elements that can be connected include, but are not limited to semiconductor dies, packaging elements, passive electronic components, leads, lead frames, packaged semiconductor components, printed circuit boards, electronic substrates, stacked die, circuit traces, circuit layers, collection grids, solar panels, electrically conductive pillars, electrically conductive cylinders, electrically conductive columns, and electrical subsystems. Application of the TLPS composition can be by any suitable method known in the art, such as needle dispensing, stenciling, screen printing, ink jetting, extrusion, casting, and spraying.

The invention will now be further described with reference to by the following illustrative, non-limiting examples. Although the foregoing invention has been described in some detail by way of illustration and example for purposes of clarity and understanding, it will be apparent to those of ordinary skill in the art in light of the teaching of this invention that certain changes and modifications may be made thereto without departing from the spirit or scope of the appended claims.

EXAMPLES

Example 1

Three TLPS compositions of the invention were prepared by admixing the components listed in Table 2 in a jar using a polyethylene paddle on a drill motor.

TABLE 2

| | Component | Formulations 458, 461 and 462 |
|---|---|---|
| TLPS Type | | (percent) |
| | Metal Powders | |
| M = Cu | Cu, 3 micron spherical | 48.52 |
| X/Y (Y = Sn) | SAC 305, spherical (varied size) | 48.52 |
| A = none | | |
| | Other Components | |
| | Fatty acid/alkanolamine salt flux | 1.99 |
| | MY721 epoxy resin | 0.88 |
| | silicone oil | 0.09 |
| | Total | 100.00 |

The particle size of the SAC 305 alloy was varied to determine the effect of the particle size of the alloy (X/Y) and the metal (M) on the strength of the joint produced. The particle sizes of the SAC 305 alloys is listed in Table 3 by formulation.

Aliquots of each formulation listed in Table 3 were coated onto copper substrates. 2×2 mm Cu pieces were placed on the wet pastes and then a hot bar set at 300° C. was used to effect a TLPS reaction, thereby bonding the copper pieces together. A Dage series 4000 die shear machine with a programmable, heated stage was then used to determine the shear force necessary to dislodge the copper pieces at various temperatures. The results are summarized in Table 3 below.

TABLE 3

| Formulation # | Alloy Particle Size | Die shear value (kg/4 mm$^2$) | | | |
|---|---|---|---|---|---|
| | | 25° C. | 140° C. | 220° C. | 300° C. |
| 458 | 10 micron | | 50.4 | 37.4 | 33.13 |
| 461 | 25 micron | 100 | 100 | 41.05 | 34.15 |
| 462 | 35 micron | 100 | 100 | 100 | 100 |

As can be seen from the results summarized in Table 3, all of the formulations maintain high adhesion at high temperature. It is also evident that as the particle size of the alloy increases relative to the particle size of the metal, the high temperature strength performance increases dramatically. Compare, for example, the die shear value at the highest temperatures tested (220° C. and 300° C.) for the 462 formulation having an alloy size of 35 microns, with the die shear values for smaller sized alloy particles (formulations 461 and 458) at the same temperatures.

Example 2

A TLPS composition (Formulation 100) of the invention was prepared by admixing the components listed in Table 4 in a jar using a polyethylene paddle on a drill motor.

TABLE 4

| | Component | Formulation 100 (%) |
|---|---|---|
| TLPS Type | | |
| | Metal Powders | |
| M = Cu | Cu, 2 micron spherical | 48.52 |
| X/Y (Y = Sn) | SAC 305, 35 micron spherical | 48.52 |
| A = none | | |
| | Other Components | |
| | Fatty acid/alkanolamine salt flux | 1.99 |
| | MY721 epoxy resin | 0.88 |
| | silicone oil | 0.09 |
| | Total | 100.00 |

In this composition, M was Cu, Y was Sn and no metal additive A was used. The last three components constitute the organic vehicle. Butyl carbitol solvent was added to the formulation to dilute the composition to a consistency suitable for printing.

The composition was applied to a square of copper 0.75"×0.75" in size and copper pieces 0.125"×0.125" were placed on top of the invention composition. A hot element set at 300° C. was applied to the top of the smaller copper pieces for 1 minute and the samples were allowed to cool. The processed samples were subjected to die shear testing at 350° C., wherein the samples were placed on a heated stage and the force required to push the small copper pieces off of the larger copper pieces was recorded. On average, 6400 pounds per square inch (psi) were required to dislodge the components. PbSn (90:10), a solder typically used for high operating temperature applications, would be molten at this temperature.

Example 3

Formulation 100 (EXAMPLE 2) was mixed according to the same procedure as the preceding examples. The composition was loaded into a syringe with a spatula and dispensed using an air pressure dispense tool onto the flat, circular head of a pin. The dispensed deposit was placed in contact with a copper surface and the construction thus formed was subjected to reflow at 300° C. After reflow, the construction was fixtured into an Instron tensile load test apparatus and the room temperature tensile load to failure was measured. The results for multiple constructions were tabulated and normalized for the joint size.

The average tensile load was 15.29 pounds which normalized to about 12,000 psi. This compares very favorably to the literature values of 6-7,000 psi for lead-free solders demonstrating the suitability of invention TLPS compositions as replacements for conventional solders.

Example 4

A composition was prepared as above according to the Formulation 200 in Table 5 below:

TABLE 5

| | Component | Formulation 200 (%) |
|---|---|---|
| TLPS Type | | |
| | Metal Powders | |
| M = Cu, 2 micron | Cu, 2 micron spherical | 26.58 |
| A = Cu, 20 micron | Cu, 20 micron spherical | 31.81 |
| X/Y (Y = Sn) | SAC 305 alloy, 35 micron spherical | 36.67 |
| | Other Components | |
| | Fatty acid/alkanolamine salt flux | 2.27 |
| | Bis F epoxy resin | 0.87 |
| | Butyl carbitol solvent | 1.35 |
| | Silicone oil | 0.08 |
| | Amide wax thixotrope | 0.24 |
| | Epoxy silane surfactant | 0.13 |
| | Total | 100.00 |

In this formulation, M is 2 micron Cu, Y is Sn, and A is 20 micron Cu.

Formulation 100 (Table 4) and Formulation 200 (Table 5) were each applied to copper substrates. 0.25 inch wide copper ribbon was placed onto the wet pastes and a hot bar set at 300° C. was used to effect a TLPS reaction and bond the copper ribbon to the copper substrates. One end of the copper ribbon in each sample was fixtured into a slotted clamp and the affixed copper substrate was held immobile. The clamped copper ribbon was pulled upward under controlled conditions and the force necessary to peel the ribbon from the substrate was measured.

The force necessary to peel the ribbon from the substrate is an indication of the ductility of the TLPS joint when the failure mode is through the joint. In all cases the failure was through the TLPS joint. Formulation 100, without optional metal additive A demonstrated a peel strength of 2.1 PLI (pounds per linear inch). Formulation 200, with optional metal additive A (20 micron Cu), demonstrated a peel strength of 9.5 PLI. This improvement in ductility as demonstrated by increased peel strength affords better reliability through a variety of mechanical stresses that might be encountered in mechanical joining applications.

Example 5

A composition was prepared as in the above EXAMPLES in accordance with Formulation 300 (Table 6).

TABLE 6

| Component | | Formulation |
|---|---|---|
| TLPS Type | | 300 (%) |
| Metal Powders | | |
| M = Cu, 2 micron | Cu, 2 micron spherical | 37.16 |
| A = Cu, 20 micron | Cu, 20 micron spherical | 13.42 |
| X/Y (Y = Sn) | SAC 305alloy, 35 micron spherical | 44.15 |
| Other Components | | |
| | Fatty acid/alkanolamine salt flux | 2.12 |
| | Bis F epoxy resin | 0.94 |
| | Glycol ether solvent | 2.00 |
| | Silicone oil | 0.05 |
| | Amide wax thixotrope | 0.12 |
| | Epoxy silane surfactant | 0.04 |
| | Total | 100.00 |

In Formulation 300, M=Cu (2 micron), Y=Sn and A=Cu (20 micron). In this formulation, Y is also in excess in order to provide additional ductility to the processed composition after the completion of the TLPS reaction.

Formulation 300 was coated onto a metal strip with a silver finish. Semiconductor die, also bearing a silver finish, were placed, silver side down, onto the wet paste. The constructions thus formed were put through a solder reflow process in a nitrogen atmosphere. The peak reflow temperature was varied between 245° C. and 275° C. The shear strength of the joints formed during the reflow process was tested on a Dage 4000 series instrument at 25° C. and 260° C. The results of this shear strength testing are tabulated in Table 7 below.

TABLE 7

| Solder Reflow Peak Temperature (° C.) | Test temperature (° C.) | Shear Strength (kg/mm$^2$) |
|---|---|---|
| 255 | 25 | 4.25 |
| 245 | 260 | 0.5 |
| 255 | 260 | 2.5 |
| 275 | 260 | 3.75 |

These results indicate that even with the excess of Y (Sn), Formulation 300 demonstrates significant mechanical strength at temperatures at which the SAC 305 solder would be molten.

What is claimed is:

1. A transient liquid phase sintering (TLPS) composition comprising:
   a) 30-70 percent by weight (wt %) of a low melting point (LMP) particle composition, wherein the particles are selected from the group consisting of particles of at least one LMP metal (Y), at least one alloy of the at least one LMP metal (X/Y), and combinations thereof;
   b) 25-65 wt % of a high melting point (HMP) particle composition, comprising at least one metallic element (M) that is reactive with the at least one LMP metal Y of the (LMP) particle composition at a process temperature T1
   wherein the HMP particle composition has an average particle size that is less than 0.5 times the average particle size of LMP particle composition;
   c) 1-15 wt % of a fluxing vehicle, and d) 10-35 wt % of a metal powder additive A, wherein the metal powder additive A has an average particle size about 0.5 to about 1.75 times the average particle size of the LMP particle composition.

2. The TLPS composition of claim 1, wherein a portion of the composition melts upon heating the composition to process temperature T1 and said portion is reduced by at least about 70% upon reheating to T1.

3. The TLPS composition of claim 1, wherein the at least one M is selected from the group consisting of Cu, Ag, Pd, Au, Al, Ni, Be, Rh, Co, Fe, Mo, W, Mn, Pt and combinations thereof.

4. The TLPS composition of claim 1, wherein at least one M is selected from the group consisting of Cu, Ag, Pd, Au, Al, Ni, Pt and combinations thereof.

5. The TLPS composition of claim 1, wherein the at least one M is Cu.

6. The TLPS composition of claim 1, wherein the at least one Y is selected from the group consisting of Sn, Bi, Zn, Ga, In, Te, Hg, Tl, Sb, Se, Pb, Cd, Po, and combinations thereof.

7. The TLPS composition of claim 1, wherein the at least one Y is selected from the group consisting of Sn, Bi, Ga, In, Zn and combinations thereof.

8. The TLPS composition of claim 1, wherein the at least one Y is selected from the group consisting of Sn, In and combinations thereof.

9. The TLPS composition of claim 1, wherein the metal additive A comprises Cu, Ag, In, Pd, Au, Ni, Ce, Pt or combinations thereof.

10. The TLPS composition of claim 1, wherein the metal additive comprises Be, Rh, Co, Fe, Mo, W, or Mn that has been alloyed, pseudo alloyed, or coated with a metal that can react with either M or Y.

11. The TLPS composition of claim 1, wherein the HMP particle composition has an average particle size less than 0.4 times the average particle size of the LMP particle composition.

12. The TLPS composition of claim 1, wherein the metal powder additive A has an average particle size about 0.5 to about 1.5 times the average particle size of the LMP particle composition.

13. The TLPS composition of claim 1, wherein all particulates are hard sieved to establish controlled particle size distributions.

14. The TLPS composition of claim 1, wherein the heat of fusion of Y or X/Y is reduced at least about 75% relative to the heat of fusion of pure Y or X/Y after processing at T1.

15. The TLPS composition of claim 1, wherein T1 is in the range of 190° C. to 400° C.

16. The TLPS composition of claim 1, wherein T1 is in the range of 200° C. to 375°.

17. The TLPS composition of claim 1, wherein T1 is in the range of 220° C. to 320°.

18. The TLPS composition of claim 1, wherein the HMP particle composition comprises at least two HMP metals M, or the LMP particle composition comprises at least two LMP metals Y or alloys X/Y.

* * * * *